(12) United States Patent
Dobrinsky et al.

(10) Patent No.: US 10,431,711 B2
(45) Date of Patent: Oct. 1, 2019

(54) SEMICONDUCTOR HETEROSTRUCTURE POLARIZATION DOPING

(71) Applicant: Sensor Electronic Technology, Inc., Columbia, SC (US)

(72) Inventors: Alexander Dobrinsky, Silver Spring, MD (US); Michael Shur, Vienna, VA (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 16/145,947

(22) Filed: Sep. 28, 2018

(65) Prior Publication Data

US 2019/0035968 A1 Jan. 31, 2019

Related U.S. Application Data

(63) Continuation of application No. 15/829,345, filed on Dec. 1, 2017, now Pat. No. 10,090,433.

(Continued)

(51) Int. Cl.
*H01L 33/00* (2010.01)
*H01L 33/06* (2010.01)
(Continued)

(52) U.S. Cl.
CPC .. *H01L 33/0025* (2013.01); *H01L 31/022408* (2013.01); *H01L 31/03048* (2013.01);
(Continued)

(58) Field of Classification Search
CPC ......... H01L 33/0025; H01L 31/035272; H01L 31/03048; H01L 31/035227;
(Continued)

(56) References Cited

U.S. PATENT DOCUMENTS 6,232,137 B1 * 5/2001 Sugawara ............. H01L 33/007
257/E21.108
7,754,515 B2 * 7/2010 Shimizu ................. H01L 33/32
257/97

(Continued)

OTHER PUBLICATIONS

Ambacher, O., "Two-dimensional electron gases induced by spontaneous and piezoelectric polarization charges in N- and Ga-face AlGaN/GaN heterostructures," Journal of Applied Physics, Mar. 15, 1999, 12 pages.

(Continued)

*Primary Examiner* — Earl N Taylor
(74) *Attorney, Agent, or Firm* — LaBatt, LLC

(57) ABSTRACT

A semiconductor heterostructure including a polarization doped region is described. The region can correspond to an active region of a device, such as an optoelectronic device. The region includes an n-type semiconductor side and a p-type semiconductor side and can include one or more quantum wells located there between. The n-type and/or p-type semiconductor side can be formed of a group III nitride including aluminum and indium, where a first molar fraction of aluminum nitride and a first molar fraction of indium nitride increase (for the n-type side) or decrease (for the p-type side) along a growth direction to create the n- and/or p-polarizations.

20 Claims, 10 Drawing Sheets

Related U.S. Application Data

(60) Provisional application No. 62/429,133, filed on Dec. 2, 2016.

(51) Int. Cl.
*H01L 33/08* (2010.01)
*H01L 33/32* (2010.01)
*H01L 33/40* (2010.01)
*H01L 31/109* (2006.01)
*H01L 31/0352* (2006.01)
*H01L 31/0304* (2006.01)
*H01L 31/0224* (2006.01)

(52) U.S. Cl.
CPC ......... *H01L 31/035227* (2013.01); *H01L 31/035236* (2013.01); *H01L 31/035272* (2013.01); *H01L 31/109* (2013.01); *H01L 33/06* (2013.01); *H01L 33/08* (2013.01); *H01L 33/32* (2013.01); *H01L 33/405* (2013.01)

(58) Field of Classification Search
CPC ..... H01L 31/035236; H01L 31/022408; H01L 33/405; H01L 33/32; H01L 33/08; H01L 33/06; H01L 31/109
See application file for complete search history.

(56) References Cited

U.S. PATENT DOCUMENTS

| | | | | |
|---|---|---|---|---|
| 7,985,964 B2* | 7/2011 | Kamiyama | ............. | H01L 33/04 257/12 |
| 8,017,932 B2* | 9/2011 | Okamoto | ............... | B82Y 20/00 257/13 |
| 8,126,024 B1* | 2/2012 | Raring | ................... | B82Y 20/00 372/45.01 |
| 8,242,522 B1* | 8/2012 | Raring | ................... | B82Y 20/00 257/13 |
| 8,254,425 B1* | 8/2012 | Raring | ................... | B82Y 20/00 372/45.01 |
| 8,294,179 B1* | 10/2012 | Raring | ................... | B82Y 20/00 257/103 |
| 8,351,478 B2* | 1/2013 | Raring | ................... | B82Y 20/00 372/44.011 |
| 8,416,825 B1* | 4/2013 | Raring | ................... | B82Y 20/00 372/45.01 |
| 8,723,189 B1* | 5/2014 | Liao | ..................... | H01S 5/34333 257/79 |
| 8,729,559 B2* | 5/2014 | Krames | ................. | C30B 25/186 257/14 |
| 8,835,998 B2* | 9/2014 | Simon | ................ | H01L 21/02389 257/11 |
| 8,837,545 B2* | 9/2014 | Raring | ................... | B82Y 20/00 372/43.01 |
| 9,099,844 B2* | 8/2015 | Raring | ................... | B82Y 20/00 |
| 9,318,652 B1* | 4/2016 | Liao | ..................... | H01S 5/34333 |
| 9,356,430 B2* | 5/2016 | Raring | ................... | B82Y 20/00 |
| 9,362,389 B2* | 6/2016 | Xing | .................... | H01L 29/7787 |
| 9,368,676 B2* | 6/2016 | Myers | ..................... | H01L 33/32 |
| 9,385,271 B2* | 7/2016 | Shur | ...................... | H01L 33/06 |
| 9,478,699 B2* | 10/2016 | Myers | ..................... | B82Y 10/00 |
| 9,553,426 B1* | 1/2017 | Raring | ................... | B82Y 20/00 |
| 9,595,634 B2* | 3/2017 | Shur | ...................... | H01L 33/06 |
| 9,627,580 B2* | 4/2017 | Liao | .................... | H01L 21/0237 |
| 9,691,938 B2* | 6/2017 | Atanackovic | ........ | H01L 33/007 |
| 9,735,547 B1* | 8/2017 | Raring | ................... | B82Y 20/00 |
| 9,871,165 B2* | 1/2018 | Atanackovic | ........ | H01L 33/007 |
| 9,882,088 B2* | 1/2018 | Fujita | ..................... | H01L 33/32 |
| 9,941,665 B1* | 4/2018 | Raring | ................... | B82Y 20/00 |
| 2013/0044782 A1* | 2/2013 | Raring | ................... | B82Y 20/00 372/45.012 |
| 2017/0018680 A1* | 1/2017 | Shur | ............... | H01L 31/035236 |
| 2017/0117438 A1* | 4/2017 | Shur | ...................... | H01L 33/06 |

OTHER PUBLICATIONS

Taylor, E., U.S. Appl. No. 15/829,345, Notice of Allowance, dated May 28, 2018, 16 pages.

\* cited by examiner

| P-Type Contact | 24 |
| --- | --- |
| Second P-Type Semiconductor Layer | 22 |
| First P-Type Semiconductor Layer | 20 |
| Active Region | 18 |

| N-Type Contact | 28 |
| --- | --- |

| N-Type Semiconductor Layer | 16 |
| --- | --- |
| Buffer Layer | 14 |
| Substrate | 12 |

| P-Type Contact | 24 |
| --- | --- |
| Second P-Type Semiconductor Layer | 22 |
| First P-Type Semiconductor Layer | 20 |
| Active Region | 18 |
| N-Type Semiconductor Layer | 16 |
| N-Type Contact | 28 |

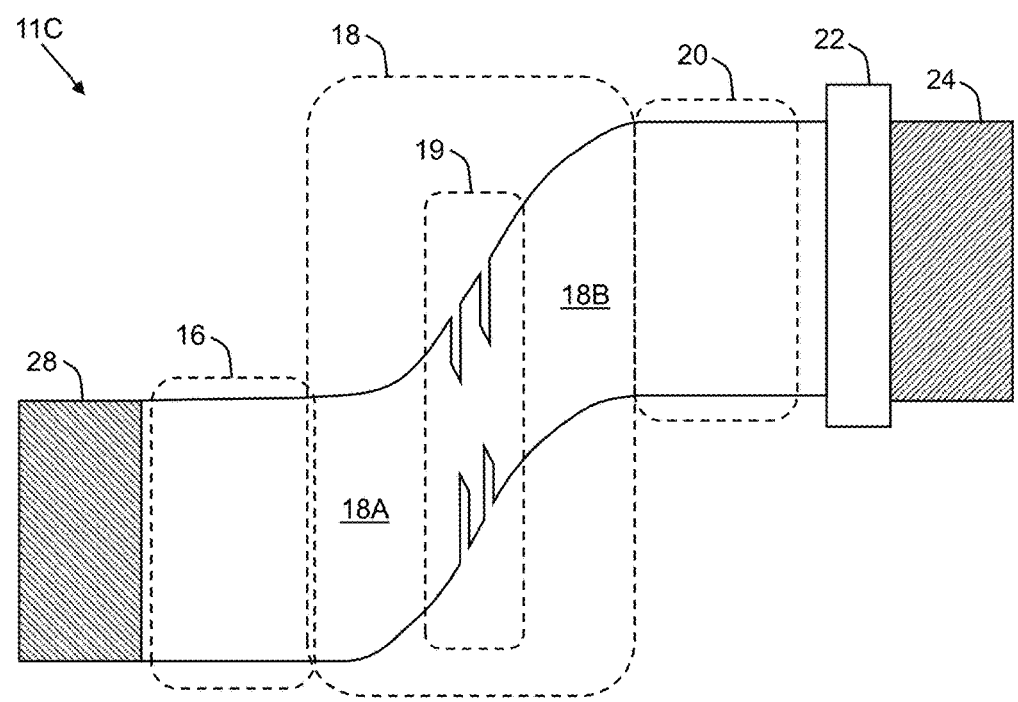

SEMICONDUCTOR HETEROSTRUCTURE POLARIZATION DOPING

REFERENCE TO RELATED APPLICATIONS

The current application is a continuation of U.S. patent application Ser. No. 15/829,345, filed on 1 Dec. 2017, which claims the benefit of U.S. Provisional Application No. 62/429,133, filed on 2 Dec. 2016, each of which is hereby incorporated by reference.

TECHNICAL FIELD

The disclosure relates generally to polarization doping, and more particularly, to the use of polarization doping to improve the efficiency of optoelectronic devices.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary, and/or quaternary alloys of indium (In), aluminum (Al), and/or gallium (Ga) with nitrogen (N). Illustrative group III nitride based LEDs and LDs can be formed of materials in the form of $In_yAl_xGa_{1-x-y}N$, where x and y indicate the molar fractions of a given element, $0 \le x$, $y \le 1$, and $0 \le x+y \le 1$. Other illustrative group III nitride based LEDs and LDs can include one or more layers formed of group III nitride materials including boron (B) nitride (BN), and can be of the form $Ga_zIn_yAl_xB_{1-x-y-z}N$, where $0 \le x$, y, $z \le 1$, and $0 \le x+y+z \le 1$.

An LED is typically composed of a heterostructure of semiconducting layers. During operation of the LED, an applied bias across doped layers leads to injection of electrons and holes into an active layer where electron-hole recombination leads to light generation. Light is generated with generally uniform angular distribution and can escape the LED die by traversing semiconductor layers in all directions. Each semiconducting layer has a particular combination of molar fractions (e.g., x, y, and z) for the various elements, which influences the optical properties of the semiconducting layer. In particular, the refractive index and absorption characteristics of a semiconducting layer are sensitive to the molar fractions of the semiconductor alloy.

An interface between two semiconductor layers is defined as a semiconductor heterojunction. At the interface, the combination of molar fractions is assumed to change by a discrete amount. A semiconductor layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the semiconductor layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by semiconductor layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determine the magnitude of Fresnel losses, which can be a significant fraction of the transmitted light.

Semiconductor layers with graded composition are well known to result in polarization doping. A previous approach suggests to use polarization doping to form a p-n junction for semiconductor nanostructures. Similar suggestions also have been proposed in the past.

SUMMARY OF THE INVENTION

Aspects of the invention provide a semiconductor heterostructure including a polarization doped region. The region can correspond to an active region of a device, such as an optoelectronic device. The region includes an n-type semiconductor side and a p-type semiconductor side and can include one or more quantum wells located there between. The n-type and/or p-type semiconductor side can be formed of a group III nitride including aluminum and indium, where a first molar fraction of aluminum nitride and a first molar fraction of indium nitride increase (for the n-type side) or decrease (for the p-type side) along a growth direction to create the n- and/or p-polarizations. In an embodiment, the inventors propose to use graded compositions of aluminum nitride and indium nitride to simultaneously control all three aspects of the device—band gap, polarization, and refractive index.

A first aspect of the invention provides a semiconductor heterostructure comprising: a polarization doped region including: an n-type semiconductor side formed of a group III nitride including aluminum and indium, wherein a first molar fraction of aluminum nitride and a first molar fraction of indium nitride increase along a growth direction of the n-type semiconductor side; and a p-type semiconductor side formed of a group III nitride including aluminum and indium, wherein a second molar fraction of aluminum nitride and a second molar fraction of indium nitride decrease along a growth direction of the p-type semiconductor side, and wherein each of the first molar fraction of indium nitride and the second molar fraction of indium nitride, is less than 0.3.

A second aspect of the invention provides an optoelectronic device comprising: a semiconductor heterostructure including a polarization doped active region, the active region including: an n-type semiconductor side formed of a group III nitride including aluminum and indium, wherein a first molar fraction of aluminum nitride and a first molar fraction of indium nitride increase along a growth direction of the n-type semiconductor side; a p-type semiconductor side formed of a group III nitride including aluminum and indium, wherein a second molar fraction of aluminum nitride and a second molar fraction of indium nitride decrease along a growth direction of the p-type semiconductor side; and a set of quantum wells located between the n-type semiconductor side and the p-type semiconductor side, and wherein each of the first molar fraction of indium nitride and the second molar fraction of indium nitride, is less than 0.3.

A third aspect of the invention provides a semiconductor heterostructure comprising: a polarization doped region including: an n-type semiconductor side formed of a group III nitride including aluminum and indium, wherein a first molar fraction of aluminum nitride and a first molar fraction of indium nitride increase along a growth direction of the n-type semiconductor side; and a p-type semiconductor side formed of a group III nitride including aluminum and indium, wherein a second molar fraction of aluminum nitride and a second molar fraction of indium nitride decrease along a growth direction of the p-type semiconductor side, and wherein each of the first molar fraction of indium nitride and the second molar fraction of indium nitride, is less than 0.3; wherein a bandgap of each of the n-type semiconductor side and the p-type semiconductor side, remains within a range of one electron volt across all of each of the n-type semiconductor side and the p-type semiconductor side.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 5A and 5B show schematic structures of illustrative optoelectronic devices according to embodiments, while FIG. 5C shows a band diagram for an illustrative optoelectronic device according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor heterostructure including a polarization doped region. The region can correspond to an active region of a device, such as an optoelectronic device. The region includes an n-type semiconductor side and a p-type semiconductor side and can include one or more quantum wells located there between. The n-type and/or p-type semiconductor side can be formed of a group III nitride including aluminum and indium, where a first molar fraction of aluminum nitride and a first molar fraction of indium nitride increase (for the n-type side) or decrease (for the p-type side) along a growth direction to create the n- and/or p-polarizations. The molar fractions can be selected to result in improved light extraction from the device.

It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. As also used herein, a "monolayer" of a semiconductor compound corresponds to a single crystal-thick layer of the semiconductor compound and corresponds to the lattice constant c for the semiconductor compound.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

Figure 1A:
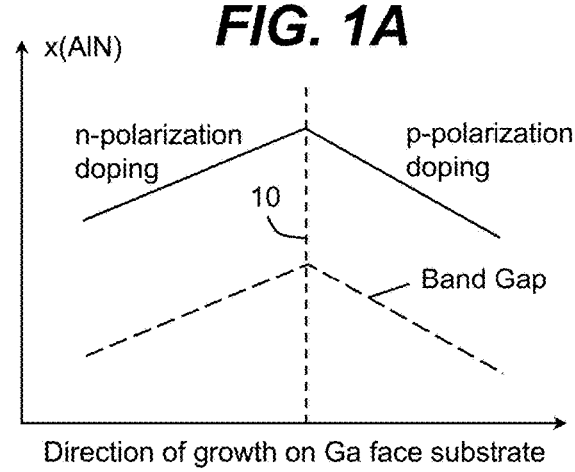
FIGS. 1A and 1B show illustrative grading of aluminum nitride and indium nitride, respectively, to create a polarization doped region including a p-n junction according to an embodiment.
Figure 1B:
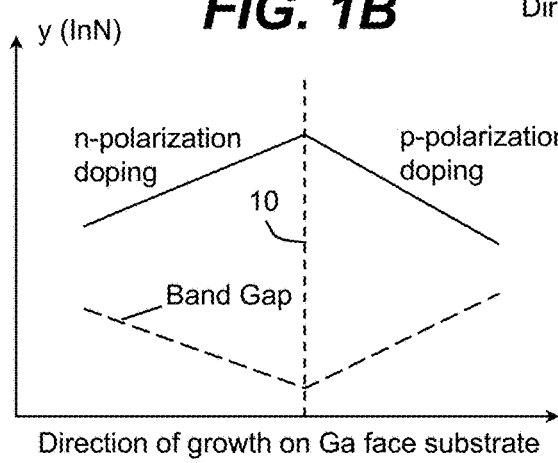

Turning to the drawings, FIGS. 1A and 1B show illustrative grading of aluminum nitride and indium nitride, respectively, to create a polarization doped region including a p-n junction 10 according to an embodiment. The semiconductor material can comprise a group III nitride material. In an embodiment, the group III nitride material comprises $Ga_zIn_yAl_xB_{1-x-y-z}N$, where $0 \leq x, y, z \leq 1$, and $0 \leq x+y+z \leq 1$. In a more particular embodiment, the group III nitride material does not include boron, i.e., $x+y+z=1$. Regardless, as illustrated, the group III nitride material includes a graded molar fraction of aluminum nitride (x) and a graded molar fraction of indium nitride (y), where the grading results in the polarization doped region having an n-type semiconductor side and a p-type semiconductor side with a p-n junction 10 located there between.

In FIGS. 1A and 1B, the polarization doped region is grown on a gallium face of a gallium nitride substrate. In this example, the n-type semiconductor side is initially grown, followed by growth of the p-type semiconductor side. During growth of the n-type semiconductor side, the aluminum nitride molar fraction and the indium nitride molar fraction increase in the direction of growth away from the substrate.

In contrast, during growth of the p-type semiconductor side, the aluminum nitride molar fraction and the indium nitride molar fraction decrease in the direction of growth away from the substrate.

Polarization of a group III nitride semiconductor alloy having a composition of $Al_xIn_yGa_{1-x-y}N$ can be described as a function of the molar fractions for the group III elements by the expression: $P=P_{Al} \times x + P_{In} \times y + P_{Ga} \times (1-x-y)$, where $P_{Al}$ is the polarization coefficient of aluminum nitride, $P_{In}$ is the polarization coefficient of indium nitride, and $P_{Ga}$ is the polarization coefficient of gallium nitride. Each polarization coefficient includes both spontaneous and piezo-polarization components, with piezo-polarization components controlled by strain within the semiconductor layer. A doping resulting from the polarization doping, D, can be calculated as a function of the semiconductor layer thickness z by the expression $D(z)=dP/dz$ and involves the calculation of molar fraction gradings: $D(z)=(P_{Aln}-P_{Ga})(dx/dz)+(P_{In}-P_{Ga})(dy/dz)$. In general, there exists a composition where the spontaneous polarization offsets the piezo-polarization, which results in an overall polarization of zero. To this extent, a composition can be tailored to minimize polarization (e.g., in a quantum well structure) and/or create polarization of a particular type and/or extent, within a range of possible polarizations for the composition.

Figure 1D:
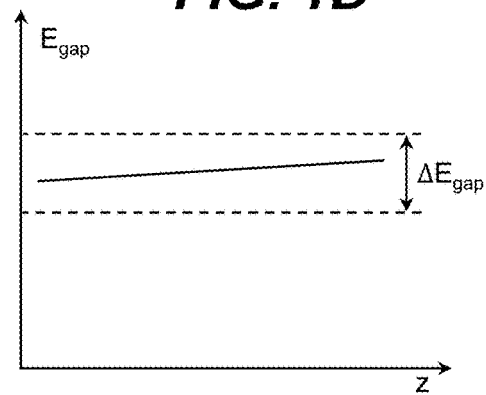
FIG. 1D shows an illustrative energy bandgap over a corresponding semiconductor layer according to an embodiment.
Figure 1C:
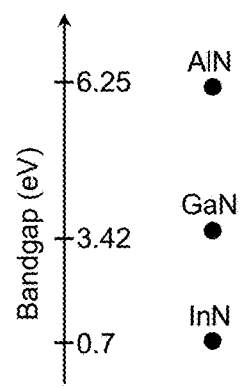
FIG. 1C illustrates the bandgaps of binary group III nitride compounds.

As also illustrated by FIGS. 1A and 1B, changes to the aluminum nitride and indium nitride molar fractions have opposite effects on the band gap of the group III nitride material. In particular, as illustrated in FIG. 1C, indium nitride has a smaller bandgap than gallium nitride, which has a smaller bandgap than aluminum nitride. As a result, as the molar fraction of aluminum nitride increases, the bandgap of the material increases. In contrast, as the molar fraction of indium nitride increases, the bandgap of the material decreases.

In an embodiment, the molar fractions of aluminum nitride and indium nitride are configured to result in a mostly constant energy bandgap, $E_{gap}$, over the corresponding n-type or p-type semiconductor side of the polarization doped region. For example, FIG. 1D shows an illustrative energy bandgap for a semiconductor side according to an embodiment. As illustrated, a range defining a maximum difference in the energy bandgap within the semiconductor side, $\Delta E_{gap}$, can be one electron volt or less. While the energy bandgap is shown increasing along a growth direction, z, it is understood that this is only illustrative. In other embodiments, the energy bandgap can decrease along the growth direction, change between increasing and decreasing one or more times, remain constant, and/or the like.

Regardless, the graded molar fraction of indium nitride can be used to compensate for a change in the energy bandgap that would otherwise occur due to the graded molar fraction of aluminum nitride. However, indium nitride is generally absorbing of ultraviolet radiation, whereas aluminum nitride is transparent. To this extent, when an ultraviolet transparent layer is desired, the amount of indium nitride included can only partially compensate for the energy bandgap change, resulting in some change in the energy bandgap but a lower amount of indium nitride present in the semiconductor material. For example, the changing energy bandgap shown in FIG. 1D can correspond to an n-type semiconductor side, in which the increasing aluminum nitride content in the growth direction is only partially compensated by an increasing indium nitride content. In an embodiment, a semiconductor material including graded aluminum nitride and graded indium nitride includes an indium nitride molar fraction of no more than 0.3 (30%).

Figure 2A:
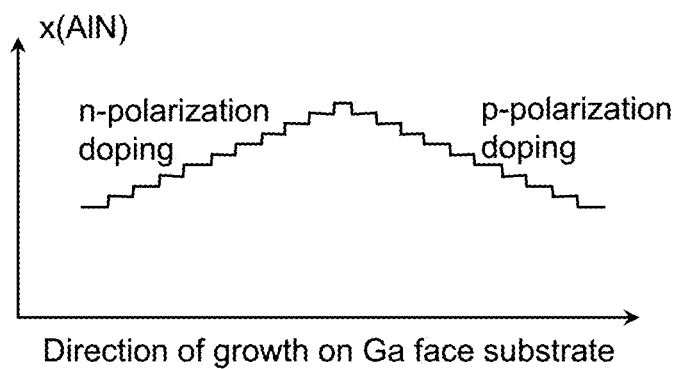
FIGS. 2A and 2B show illustrative grading of aluminum nitride and indium nitride, respectively, according to another embodiment.
Figure 2B:
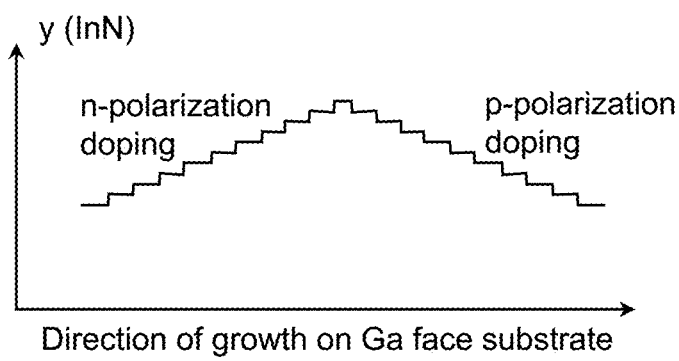

In FIGS. 1A and 1B, the aluminum nitride and indium nitride molar fractions can change across one or both sides in a substantially constant, continuous manner. However, it is understood that changes to the aluminum nitride and indium nitride molar fractions can change in any of various different approaches. For example, FIGS. 2A and 2B show illustrative grading of aluminum nitride and indium nitride, respectively, according to another embodiment. In this case, the grading is performed in a stepwise manner, thereby creating a plurality of sub-layers within each semiconductor side with increasing or decreasing aluminum nitride and indium nitride molar fractions. In an embodiment, each sub-layer (step) can have a thickness of no more than ten monolayers of the semiconductor compound. In an embodiment the molar fractions of aluminum nitride and indium nitride can change at different rates. For example, rates of change of the molar fractions of aluminum nitride and indium nitride can be selected to maintain a small variation within the band gap of a semiconductor heterostructure.

Figure 3A:
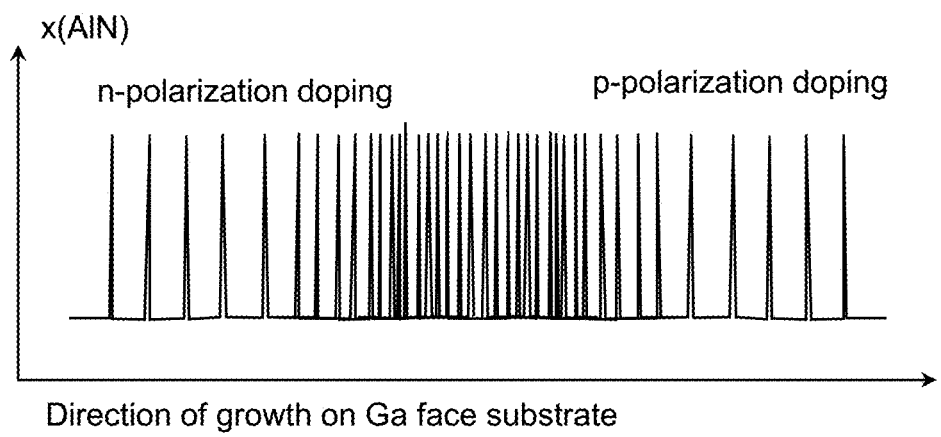
FIGS. 3A and 3B show still another approach for creating an n-type or p-type polarization in a semiconductor layer according to an embodiment.
Figure 3B:
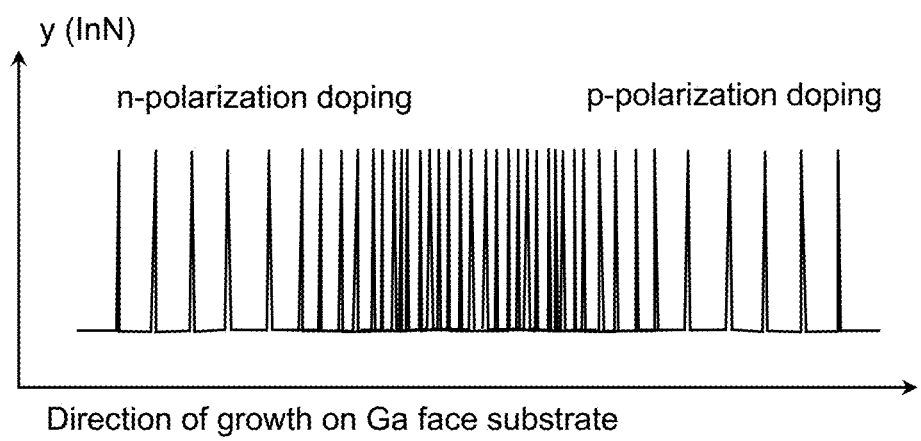

FIGS. 3A and 3B show still another approach for creating an n-type or p-type polarization in a semiconductor material according to an embodiment. In this case, the semiconductor layer can comprise a base semiconductor material that remains substantially constant across a thickness of the layer. The base semiconductor material is interrupted by sub-layers of aluminum nitride (shown in FIG. 3A) and sub-layers of indium nitride (shown in FIG. 3B). Each sub-layer can have a thickness of a single monolayer to no more than ten monolayers (five monolayers in a more specific embodiment). As illustrated, a frequency of the sub-layers can be increased or decreased along the growth direction to create n-polarization doping or p-polarization doping, respectively. In an embodiment, the sub-layers of aluminum nitride and/or the sub-layers of indium nitride are separated by no more than ten monolayers of the base semiconductor material. In an embodiment, an aluminum nitride monolayer and an indium nitride monolayer can be combined into a single sub-layer comprising AlInN. In this case, the single sub-layer can include any relative molar composition of aluminum nitride and indium nitride, which can be selected to, for example, limit the changes in bandgap. In an embodiment, the molar composition of indium nitride is much lower than the molar composition of aluminum nitride, which can result in the heterostructure having an improved ultraviolet transparency.

In each of the p-n junctions shown in FIGS. 1A-3B, the aluminum nitride and indium nitride molar fractions are increasing in a direction toward the p-n junction. However, it is understood that this is only illustrative, and the aluminum nitride and indium nitride molar fractions can decrease in a direction toward the p-n junction.

Figure 4A:
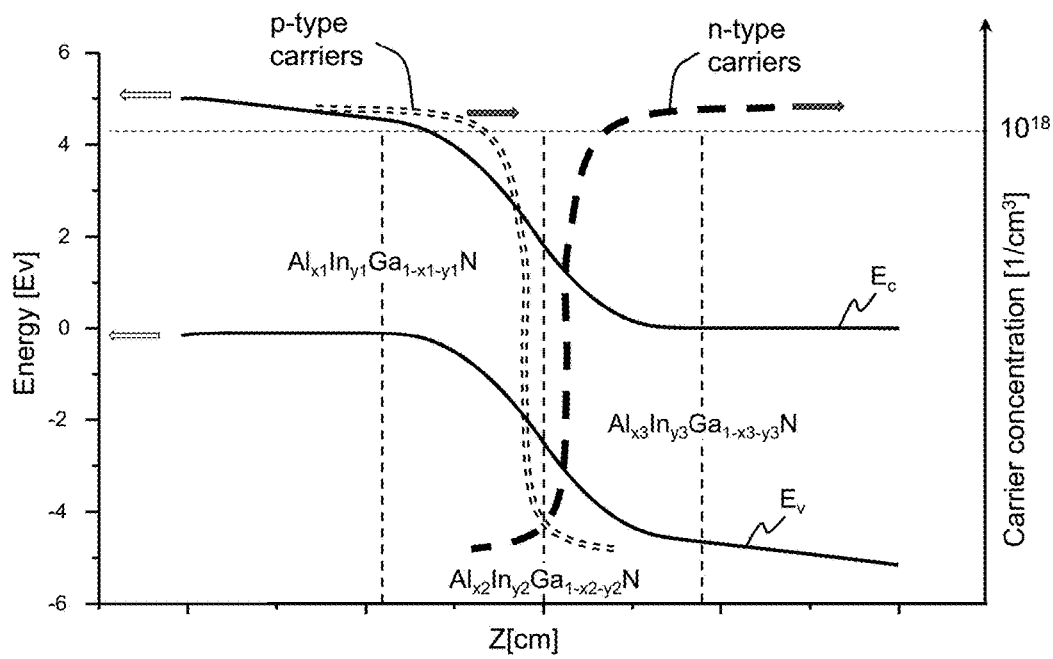
FIGS. 4A and 4B show illustrative semiconductor layers with graded aluminum nitride and indium nitride and forming a p-n junction according to another embodiment.
Figure 4B:
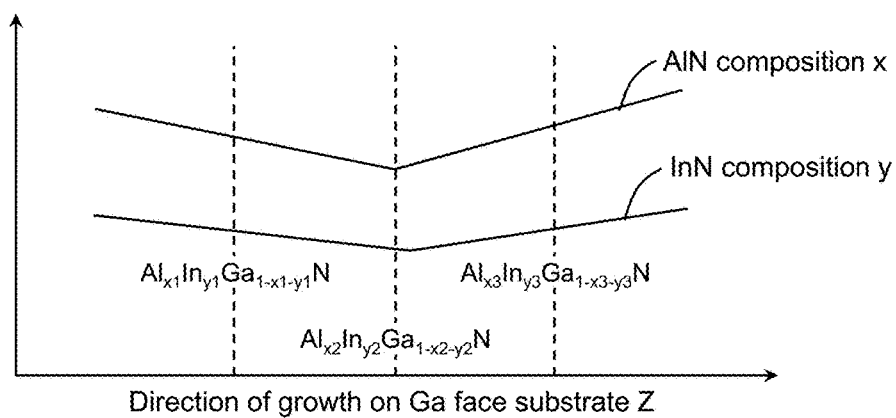

To this extent, FIGS. 4A and 4B show illustrative semiconductor layers with graded aluminum nitride and indium nitride and forming a p-n junction according to another embodiment. As illustrated in FIG. 4B, the n-polarization and p-polarization can be created in each side by a graded aluminum nitride molar fraction and a graded indium nitride molar fraction for each side. The grading for aluminum nitride can have a steeper slope than the grading for indium nitride. Additionally, a change in the slopes for aluminum nitride molar fraction and the indium nitride molar fraction can occur at different locations within the semiconductor structure. Regardless, the molar fraction of the aluminum nitride can be larger than the molar fraction of the indium nitride. A p-polarized semiconductor side can have a composition $Al_{x1}In_{y1}Ga_{1-x1-y1}N$ as the corresponding dashed line, the p-n junction can have a composition $Al_{x2}In_{y2}Ga_{1-x2-y2}N$, and the n-polarized semiconductor side can have a composition $Al_{x3}In_{y3}Ga_{1-x3-y3}N$ at the corresponding dashed line.

As illustrated in FIG. 4A, a bandgap (e.g., a difference between conduction energy band, $E_C$, and the valence energy band, $E_V$) can be smaller at the p-n junction and increase in a direction away from the p-n junction in both the n-polarized and p-polarized semiconductor sides. In this case, the graded indium nitride only partially compensates for a change in the bandgap resulting from the graded aluminum nitride.

For both the p-polarized and n-polarized semiconductor sides, the aluminum nitride and indium nitride molar fractions increase with distance from the p-n junction, e.g., x2<x1, x3 and y2<y1, y3. Such a p-n junction can be beneficial as it can be designed to be largely transparent to light in the ultraviolet wave range. As also illustrated in FIG. 4A, polarization due to graded composition as described herein can result in significant doping within the corresponding semiconductor sides. For example, the carrier concentration for the semiconductor sides illustrated in FIG. 4A is shown by the dashed lines and results in carrier concentrations of more than $10^{18}$ 1/cm$^3$ in each semiconductor side.

As discussed herein, regardless of an approach used, the semiconductor layer can have increasing or decreasing molar fractions of aluminum nitride and indium nitride across a thickness of the layer. As used herein, the molar fractions can be calculated as a running average molar fraction across a portion of a thickness of the semiconductor layer. In a more particular embodiment, the running average is calculated over a thickness of a few tens of nanometers (e.g., fifty nanometers or less) of the semiconductor layer.

In an embodiment, the n-polarized and p-polarized semiconductor sides shown in FIGS. 1A-4B do not include any intentional doping with a dopant (i.e., the semiconductor layers are undoped). However, it is understood that one or both of the n-polarized and p-polarized semiconductor sides also can be doped with a corresponding suitable impurity. Such intentional doping can be performed in combination with the graded aluminum nitride and indium nitride described herein.

While each pair of illustrative n-polarized and p-polarized semiconductor sides shown in FIGS. 1A-4B can utilize the same grading strategy to result in the corresponding polarization doping, it is understood that this is only illustrative, and different approaches can be used to create the desired polarization doping in n-polarized and p-polarized semiconductor sides in a structure. For example, the n-polarized and p-polarized semiconductor sides can utilized different grading strategies and/or doping to create the n-type and p-type polarizations of each side. Similarly, when a heterostructure includes more than one n-polarized and/or more than one p-polarized semiconductor layer, the semiconductor layers of the same polarization can use different polarization approaches to result in the desired polarizations.

FIGS. 5A and 5B show schematic structures of illustrative optoelectronic devices 11A and 11B according to embodiments, while FIG. 5C shows a band diagram for an illustrative optoelectronic device 11C according to an embodiment. Each optoelectronic device 11A-11C can be any type of optoelectronic device. In a more particular embodiment, an optoelectronic device 11A-11C is configured to operate as an emitting device, such as a light emitting diode (LED) or a laser diode (LD). In either case, during operation of the optoelectronic device 11A-11C, application of a bias comparable to the band gap results in the emission of electromagnetic radiation from an active region 18 of the optoelectronic device 11A-11C. Alternatively, the optoelectronic device 11A-11C can operate as a sensing device, such as a photodiode.

The electromagnetic radiation emitted (or sensed) by the optoelectronic device 11A-11C can have a peak wavelength within any range of wavelengths, including visible light, ultraviolet radiation, deep ultraviolet radiation, infrared light, and/or the like. In an embodiment, the device 11A-11C is configured to emit (or sense) radiation having a dominant wavelength within the ultraviolet range of wavelengths. In a more specific embodiment, the dominant wavelength is within a range of wavelengths between approximately 210 and approximately 360 nanometers.

As described herein, the various layers of each optoelectronic device 11A-11C are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

The optoelectronic device 11A includes a heterostructure comprising a substrate 12, a buffer layer 14 adjacent to the substrate 12, an n-type semiconductor layer 16 (e.g., a cladding layer, electron supply layer, contact layer, and/or the like) adjacent to the buffer layer 14, and an active region 18 having an n-type side adjacent to the n-type semiconductor layer 16. Furthermore, the heterostructure of the optoelectronic device 11A includes a first p-type semiconductor layer 20 (e.g., an electron blocking layer, a cladding layer, hole supply layer, and/or the like) adjacent to a p-type side of the active region 18 and a second p-type semiconductor layer 22 (e.g., a cladding layer, hole supply layer, contact layer, and/or the like) adjacent to the first p-type layer 20.

The optoelectronic device 11A can further include a p-type contact 24, which can form an ohmic contact to the second p-type layer 22, and an n-type contact 28, which can form an ohmic contact to the n-type semiconductor layer 16. In an embodiment, one or both of the p-type contact 24 and the n-type contact 28 comprises several conductive and reflective metal layers. In an embodiment, the second p-type layer 22 can be transparent to the electromagnetic radiation generated by the active region 18. For example, the second p-type layer 22 can have a thickness of fifty nanometers or less and/or comprise a short period superlattice lattice structure, such as an at least partially transparent magnesium (Mg)-doped AlGaN/AlGaN short period superlattice structure (SPSL). In another embodiment, the n-type layer 16 can be formed of a short period superlattice, such as an AlGaN SPSL, which is transparent to the electromagnetic radiation generated by the active region 18.

The device 11A can be operated in a flip chip configuration. In this case, the substrate 12 is located on the top of the optoelectronic device 11A and can be the primary emitting/absorbing surface of the device 11A. When the optoelectronic device 11A is configured to be operated in a flip chip configuration, the substrate 12 and buffer layer 14 should be transparent to the target electromagnetic radiation emitted or sensed by the active region 18. To this extent, for an ultraviolet optoelectronic device 11A, an embodiment of the substrate 12 is formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, LiGaO$_2$, lithium aluminate (γ-LiAlO$_2$), LiAlO$_2$, lithium gallate, aluminum oxinitride (AlO$_x$N$_y$), spinel (MgAl$_2$O$_4$), GaAs, Ge, zinc oxide (ZnO), aluminum zinc oxide, or another suitable material. An embodiment of the substrate 12 can include metallic seed elements for nucleation of semiconductor layers and subsequent epitaxy thereon. Another illustrative substrate 12 can comprise a composite substrate with a top (growth) layer formed of AlGaN. Such a substrate include metallic seed elements deposited over the AlGaN layer. Furthermore, a surface of the substrate 12 can be substantially flat or patterned using any solution.

In contrast, the schematic structure of the optoelectronic device 11B is shown including an n-type contact 28 formed adjacent to a bottom surface of the n-type semiconductor layer 16. In this case, the heterostructure of the optoelectronic device 11B can include no substrate and/or buffer layer, which can be, for example, removed after fabrication of some or all of the heterostructure using any solution.

FIG. 5C shows a bandgap diagram of an illustrative optoelectronic device 11C having an arrangement similar to the optoelectronic device 11B shown in FIG. 5B. To this extent, the optoelectronic device 11C includes an n-type contact 28, which can comprise any suitable metallic contact, such as aluminum, titanium, and/or chromium. The n-type semiconductor layer can comprise any type of n-type semiconductor contact layer, such as an AlGaN layer. In an embodiment, the n-type semiconductor layer 16 has an n-type doping with a dopant concentration of at least $10^{18}$ cm$^{-3}$. In another embodiment, the dopant concentration of the n-type semiconductor layer 16 can be graded, e.g., through the use of delta doping. The grading can result in a decreased doping on a side closer to the active region 18. The active region 18 can include an n-type side 18A having n-polarization doping and a p-type side 18B having p-polarization doping. The corresponding polarization doping for one or both sides 18A, 18B can result from a graded AlInGaN semiconductor alloy described herein. A central region 19 of the active region 18 can include a set of quantum wells and barriers (e.g., two quantum wells are shown).

The device can further include a first p-type semiconductor layer 20 having p-type polarization doping. Embodiments of the p-type semiconductor layer 20 can comprise: a p-type superlattice of Al$_{x1}$In$_{y1}$Ga$_{1-x1-y1}$N/Al$_{x2}$In$_{y2}$Ga$_{1-x2-y2}$N; one or more layers, such as GaN layers, with high p-type doping; and/or the like. In an embodiment, the p-type semiconductor layer 20 can include thin interlayers (e.g., five monolayers or less) of a transparent composition. For example, the interlayers can have an aluminum nitride molar ratio larger than the aluminum nitride molar ratio within the barriers of active layer, which results in transparent layers to radiation generated and/or sensed by the active region 18. Such interlayers can be beneficial for a light emitting diode operating in the ultraviolet radiation wavelength. In an embodiment, the interlayers can be formed of boron nitride and have a thickness of ten nanometers or smaller. The optoelectronic device 11C is further shown including a second p-type semiconductor layer 22 (e.g., a group III nitride material having a gallium nitride molar ratio higher than the previous layers), which can have a high p-type doping, and a p-type metallic contact 24. In an embodiment, one or both of the p-type semiconductor layers 20, 22 has a p-type doping with a dopant concentration of at least $10^{18}$ cm$^{-3}$. In another embodiment, the dopant concentration of the p-type semiconductor layer 20, 22 can be graded, e.g., through the use of delta doping. The grading can result in a decreased doping on a side closer to the active region 18.

When the p-type semiconductor layer 22 has a high aluminum nitride molar fraction, a large barrier can be formed to the active region 18, which results in the optoelectronic device 11C having a large resistance. Additionally, it is difficult to fabricate a p-type metallic contact to a semiconductor layer with a high aluminum nitride molar fraction. To this extent, an embodiment of an optoelectronic device described herein can include a tunneling junction on the p-type side of the active region 18.

Figure 6A:
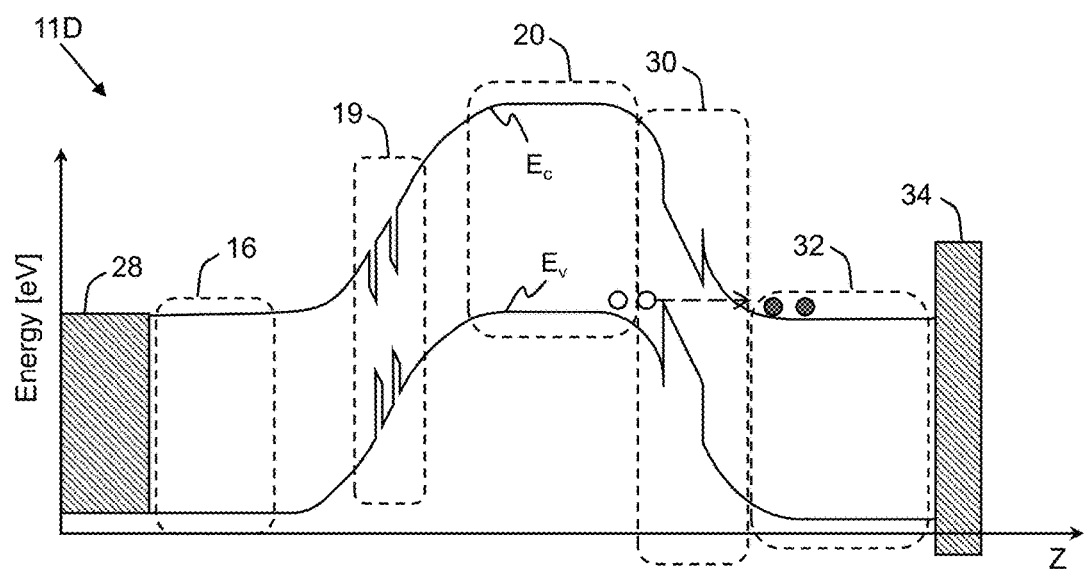
FIGS. 6A and 6B show an illustrative bandgap diagram and aluminum nitride and indium nitride composition variance, respectively, of an illustrative optoelectronic device according to an embodiment.
Figure 6B:
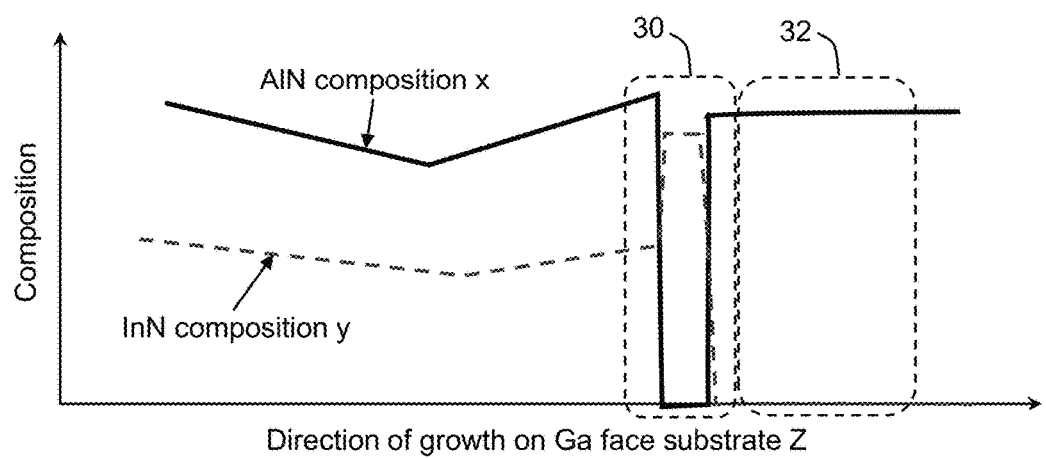

For example, FIGS. 6A and 6B show an illustrative bandgap diagram and aluminum nitride and indium nitride composition variance, respectively, of an illustrative optoelectronic device according to an embodiment. The optoelectronic device 11D is shown including a tunneling junction 30, which can be formed between the first p-type semiconductor layer 20 and a second semiconductor layer 32 located next to a contact 34. The tunneling junction 30 can comprise a material configured to approximately align a valence band of the p-type semiconductor layer 20 with a conduction band of the second semiconductor layer 32. Such alignment results in electron tunneling from the valence band of the p-type semiconductor layer 20 into the conductive band of the second semiconductor layer 32, thereby supplying holes to the p-type semiconductor layer 20.

The composition of the tunneling junction 30 can be selected to result in a significant alignment between the valence band of the p-type semiconductor layer 20 and the conduction band of the second semiconductor layer 32 to provide a small amount of resistance for the tunneling junction 30. For example, in an embodiment, a voltage drop across the tunneling junction 30 can be no more than approximately thirty percent of a voltage drop for the optoelectronic device 11D. As illustrated in FIG. 6B, the tunneling junction 30 can comprise a layer of InN or InGaN. However, it is understood that other materials can be utilized. For example, an embodiment of the tunneling junction 30 comprises a gadolinium nitride (GdN)-based GaN tunnel junction. The tunneling junction 30 also can be a thin p-type layer having a thickness of no more than a few tens of nanometers (e.g., fifty nanometers or less), thereby resulting in a relatively low absorption of ultraviolet light.

In an embodiment, the second semiconductor layer 32 can be formed of an n-type AlInGaN semiconductor material and the contact 34 can comprise an n-type contact thereto. In an embodiment, the second semiconductor layer 32 is transparent to ultraviolet radiation and comprises a group III nitride semiconductor layer having a high AlN molar fraction. In an alternative embodiment, the second semiconductor layer 32 comprises a Bragg reflector, which can be fabricated by alternating semiconductor sub-layers with different refractive indexes. In an embodiment, the contact 34 can comprise a metallic contact including aluminum and/or titanium. Furthermore, an embodiment of the contact 34 can be reflective to radiation emitted and/or sensed by the active region 18.

Figure 7A:
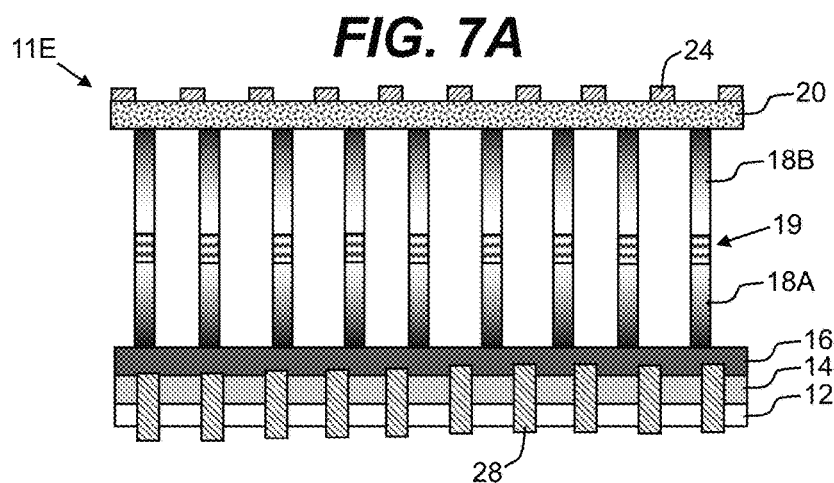
FIGS. 7A and 7B show illustrative optoelectronic devices with nanostructures according to embodiments.
Figure 7B:
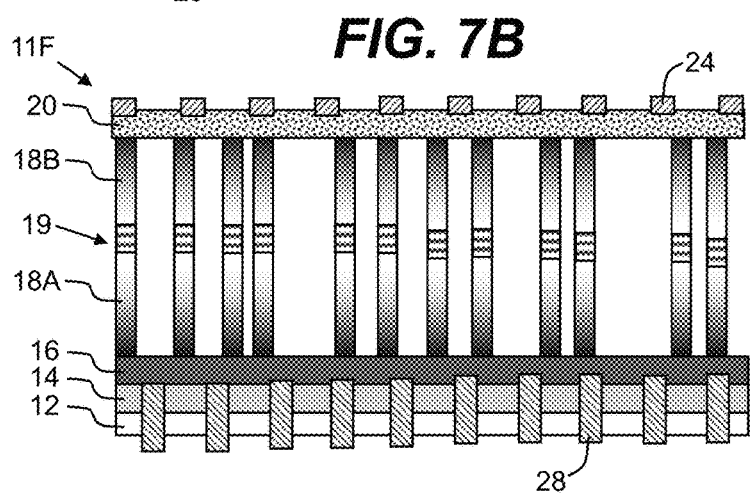

In an embodiment, a device described herein, such as an optoelectronic device 11A-11D, can include one or more layers including nanostructures. For example, FIGS. 7A and 7B show illustrative optoelectronic devices 11E, 11F, respectively, with nanostructures according to embodiments. Each device 11E, 11F can include a substrate 12, a buffer (e.g., nucleation) layer 14, and a n-type semiconductor layer 16. An active region of each device can comprise a plurality of nanowires that are grown on the n-type semiconductor layer 16. In particular, each nanowire can include an n-type side 18A having n-polarization doping and a p-type side 18B having p-polarization doping. The corresponding polarization doping for one or both sides 18A, 18B can result from a graded AlInGaN semiconductor alloy described herein. A central region 19 of the active region can include a set of quantum wells and barriers. The tops of the nanowires can be contacted by a p-type semiconductor layer 20.

As illustrated in optoelectronic device 11E, the nanowires can form a periodic arrangement. Alternatively, as illustrated in optoelectronic device 11F, the nanowires can have an aperiodic arrangement. It is understood that the nanowires shown in conjunction with optoelectronic devices 11E, 11F are only illustrative. Additionally, it is understood that the nanowires can be fabricated using any solution. In an embodiment, the nanowires are fabricated and include one or more features as described in U.S. patent application Ser. No. 15/331,896, filed 23 Oct. 2016, which is hereby incorporated by reference. For example, the nanowires can contain structures with variable lateral cross section, the surface of the nanowires can be passivated to avoid parasitic recombination over the nanowire surface, and/or the like. Furthermore, a nanowire can include one or more features described herein. For example, some or all of the nanowires can include a tunneling junction located on the p-type side 18B of the active region.

Figure 7C:
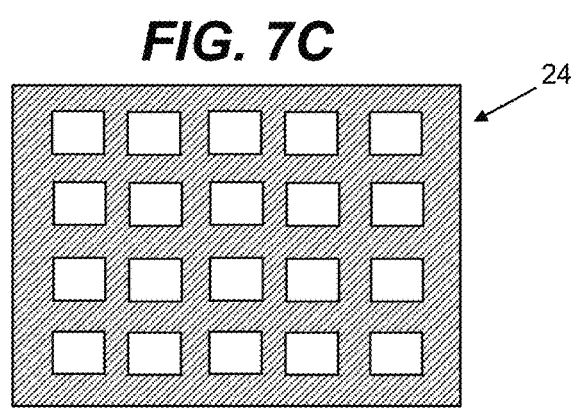
FIG. 7C shows a top view of an illustrative p-type contact having a mesh structure according to an embodiment.

The n-type semiconductor layer 16 can be contacted by a set of n-type electrodes of an n-type contact 28. As illustrated, the electrodes can penetrate openings in the substrate 12 and the buffer layer 14 to directly contact a surface of the n-type semiconductor layer 16. Similarly, the p-type semiconductor layer 20 can be contacted by a set of p-type electrodes of a p-type contact 24. In an embodiment, one or both of the contacts 24, 28 can have a mesh structure. For example, FIG. 7C shows a top view of an illustrative p-type contact 24 having a mesh structure according to an embodiment. However, it is understood that the mesh structure shown in FIG. 7C is only illustrative of various possible mesh structures.

While the various optoelectronic devices shown herein have included a single p-n junction, it is understood that embodiments of an optoelectronic device described herein can include multiple p-n junctions, one or more of which can be formed using a compositional grading approach described herein. When an optoelectronic device includes multiple p-n junctions, adjacent p-n junctions can be connected by one or more tunneling regions, each of which can be configured as described herein. Additionally, it is understood that an optoelectronic device described herein can include one or more additional features. For example, an optoelectronic device can include stress controlling layers, where the stress controlling layers comprise semiconductor layers with a lattice mismatch of at least 0.5% between immediately adjacent layers, each having a thickness of no more than ten nanometers. The stress controlling layers can be selected to modify emitted light polarization. For instance, in order to control polarization within the active region, stress control layers can be inserted within the active region. In an embodiment, stress controlling interlayers can be inserted within the barriers of the active region. Additionally, such stress controlling layers can be part of the quantum well layers of the active region.

For improved light extraction, optimization of the indexes of refraction in the various layers of a heterostructure is important. For example, when the index of refraction of the active layer is lower than the index of refraction of the surrounding layers, there is no total internal refraction between the active layer and the surrounding layers thereby leading to increased light extraction. The semiconductor layer $Al_xIn_yGa_{1-x-y}N$ described herein allows for optimizing the indexes of refraction through the composition selection. Such layers can be selected to have an appropriate bandgap to result in transparency to target radiation. Selecting an active layer with a low index of refraction will further increase the light extraction efficiency of the corresponding optoelectronic device. In an embodiment, an active region described herein has an index of refraction that is at least 0.5% lower than the indexes of refraction for each of the n-type and p-type semiconductor layers located adjacent to the active region. Such an approach can be further combined with other well-known techniques such as roughness at the light emitting surface/ambient interface, as well as utilization of optical elements such as lenses.

Figure 8:
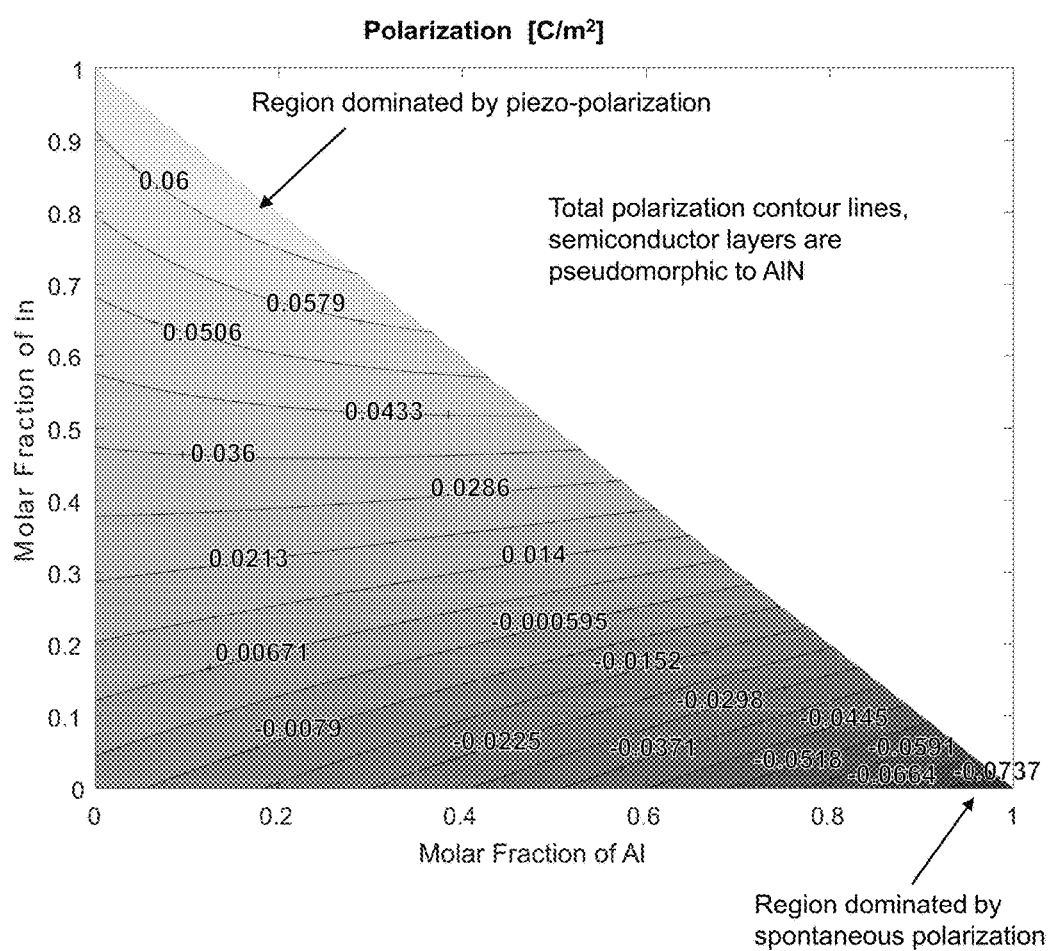
FIG. 8 shows polarization of an $Al_xIn_yGa_{1-x-y}N$ semiconductor layer pseudomorphically grown over an AlN layer.

FIG. 8 shows polarization of an $Al_xIn_yGa_{1-x-y}N$ semiconductor layer pseudomorphically grown over an AlN layer. As illustrated, polarization control can be achieved by selecting an appropriate semiconductor layer $Al_xIn_yGa_{1-x-y}N$. Both positive and negative polarization can be achieved, due to the canceling effects of spontaneous and piezo-polarization. In FIG. 8, the layers are assumed to have a lattice constant pseudomorphic to AlN. For example, for an InN layer grown on AlN, the polarization is as much as 0.06 C/m$^2$ due to a high piezoelectric strain resulting in high positive polarization. Using a semiconductor alloy such as $Al_xIn_yGa_{1-x-y}N$, a composition can be selected for improved light extraction by optimizing the indexes of refraction of the layers within the semiconductor structure. Controlling polarization within the active region allows for an improvement in electron-hole recombination, which in turn leads to increased internal quantum efficiency.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 9:
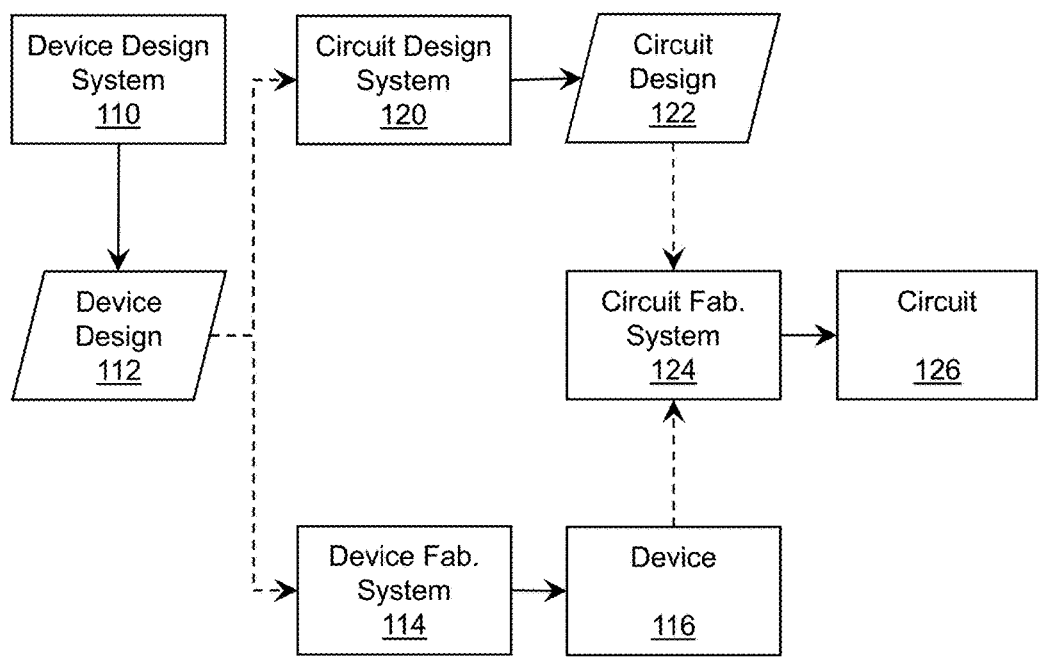
FIG. 9 shows an illustrative flow diagram for fabricating a circuit according to an embodiment.

In one embodiment, the invention provides a method of designing and/or fabricating a circuit that includes one or more of the optoelectronic devices designed and fabricated as described herein. To this extent, FIG. 9 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

As used herein, unless otherwise noted, the term "set" means one or more (i.e., at least one) and the phrase "any solution" means any now known or later developed solution. The singular forms "a," "an," and "the" include the plural forms as well, unless the context clearly indicates otherwise. Additionally, the terms "comprises," "includes," "has," and related forms of each, when used in this specification, specify the presence of stated features, but do not preclude the presence or addition of one or more other features and/or groups thereof.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure comprising:
   a doped region including:
      an n-type semiconductor side formed of a group III nitride including aluminum and gallium, wherein the n-type semiconductor side is n-type doped and includes a first molar fraction of aluminum nitride; and
      a p-type semiconductor side formed of a group III nitride including aluminum and indium, wherein a second molar fraction of aluminum nitride and a molar fraction of indium nitride decrease along a growth direction of the p-type semiconductor side, and
   wherein the molar fraction of indium nitride is less than 0.3.

2. The heterostructure of claim 1, wherein the p-type semiconductor side further includes gallium.

3. The heterostructure of claim 1, wherein the first molar fraction of aluminum nitride increases along a growth direction of the n-type semiconductor side resulting in n-type doping.

4. The heterostructure of claim 1, wherein at least one of: the n-type semiconductor side or the p-type semiconductor side, is not intentionally doped with a dopant.

5. The heterostructure of claim 1, wherein the polarized doped region includes an average of at least $10^{18}$ carriers per centimeter cubed.

6. The heterostructure of claim 1, wherein at least one of: a bandgap of the n-type semiconductor side or a bandgap of the p-type semiconductor side, remains within a range of one electron volt across all of the at least one of: the n-type semiconductor side or the p-type semiconductor side.

7. The heterostructure of claim 6, wherein the bandgaps of both the n-type semiconductor side and the p-type semiconductor side remain within a range of one electron volt across all of the n-type semiconductor side and the p-type semiconductor side.

8. The heterostructure of claim 1, wherein the semiconductor heterostructure includes a plurality of nanostructures, each nanostructure including the doped region.

9. The heterostructure of claim 1, further comprising a tunneling junction located on the p-type side of the doped region.

10. The heterostructure of claim 9, wherein the tunneling junction comprises one of: a layer of InN or a layer of InGaN.

11. The heterostructure of claim 1, wherein the doped region further includes a set of quantum wells located between the n-type semiconductor side and the p-type semiconductor side, wherein each quantum well in the set of quantum wells has a bandgap lower than the n-type semiconductor side and the p-type semiconductor side in the doped region.

12. The heterostructure of claim 1, wherein the doped region corresponds to an active region, wherein the first molar fraction of aluminum nitride increases along a growth direction of the n-type semiconductor side resulting in n-type doping, the heterostructure further comprising:

a first n-type semiconductor layer located adjacent to the n-type semiconductor side of the doped region, wherein the n-type semiconductor layer comprises an n-type doped semiconductor; and a p-type semiconductor layer located adjacent to the p-type semiconductor side of the doped region, wherein the p-type semiconductor layer comprises a p-type doped semiconductor.

13. The heterostructure of claim 12, further comprising:
an n-type metal contact contacting the first n-type semiconductor layer; and
a p-type metal contact contacting the p-type semiconductor layer.

14. The heterostructure of claim 12, further comprising:
a tunneling junction located adjacent to the p-type semiconductor layer; and
a second n-type semiconductor layer located adjacent to the tunneling junction.

15. The heterostructure of claim 14, further comprising:
a first n-type metal contact contacting the first n-type semiconductor layer; and
a second n-type metal contact contacting the second n-type semiconductor layer.

16. An optoelectronic device comprising:
a semiconductor heterostructure including a doped active region, the active region including:
  an n-type semiconductor side formed of a group III nitride including aluminum and gallium, wherein the n-type semiconductor side is n-type doped and includes a first molar fraction of aluminum nitride;
  a p-type semiconductor side formed of a group III nitride including aluminum and indium, wherein a second molar fraction of aluminum nitride and a molar fraction of indium nitride decrease along a growth direction of the p-type semiconductor side; and
  a set of quantum wells located between the n-type semiconductor side and the p-type semiconductor side, and
  wherein the molar fraction of indium nitride, is less than 0.3.

17. The device of claim 16, wherein the first molar fraction of aluminum nitride increases along a growth direction of the n-type semiconductor side, the heterostructure further comprising:
a first n-type semiconductor layer located adjacent to the n-type semiconductor side of the doped active region, wherein the n-type semiconductor layer comprises an n-type doped semiconductor;
a p-type semiconductor layer located adjacent to the p-type semiconductor side of the doped active region, wherein the p-type semiconductor layer comprises a p-type doped semiconductor;
a tunneling junction located adjacent to the p-type semiconductor layer; and
a second n-type semiconductor layer located adjacent to the tunneling junction.

18. The device of claim 17, further comprising:
a first n-type metal contact contacting the first n-type semiconductor layer; and
a second n-type metal contact contacting the second n-type semiconductor layer.

19. A semiconductor heterostructure comprising:
a polarization doped region including:
  a p-type semiconductor side formed of a group III nitride including aluminum and indium, wherein a second molar fraction of aluminum nitride and a second molar fraction of indium nitride decrease along a growth direction of the p-type semiconductor side, and
  an n-type semiconductor side formed of a group III nitride including aluminum and indium, wherein a first molar fraction of aluminum nitride and a first molar fraction of indium nitride increase along a growth direction of the n-type semiconductor side, wherein the n-type semiconductor side is grown after the p-type semiconductor side; and
  wherein each of the first molar fraction of indium nitride and the second molar fraction of indium nitride, is less than 0.3;
  wherein a bandgap of each of the n-type semiconductor side and the p-type semiconductor side, remains within a range of one electron volt across all of each of the n-type semiconductor side and the p-type semiconductor side.

20. The heterostructure of claim 19, wherein the polarization doped region further includes a set of quantum wells located between the n-type semiconductor side and the p-type semiconductor side, wherein each quantum well in the set of quantum wells has a bandgap lower than the n-type semiconductor side and the p-type semiconductor side in the polarization doped region.

* * * * *